(12) United States Patent
Woerlee et al.

(10) Patent No.: US 6,743,682 B2
(45) Date of Patent: Jun. 1, 2004

(54) METHOD OF MANUFACTURING A SEMICONDUCTOR DEVICE

(75) Inventors: Pierre Hermanus Woerlee, Eindhoven (NL); Jurriaan Schmitz, Eindhoven (NL); Andreas Hubertus Montree, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 41 days.

(21) Appl. No.: 10/100,595

(22) Filed: Mar. 18, 2002

(65) Prior Publication Data

US 2002/0094647 A1 Jul. 18, 2002

Related U.S. Application Data (63) Continuation of application No. 09/738,917, filed on Dec. 14, 2000.

(30) Foreign Application Priority Data

Dec. 17, 1999 (EP) ............................................. 99204374

(51) Int. Cl.⁷ ............................................. H01L 21/336
(52) U.S. Cl. ........................ 438/291; 438/289; 438/303
(58) Field of Search ................................. 438/291, 197, 438/585, 595, 692, 719, 735, 301, 289, 303

(56) References Cited

U.S. PATENT DOCUMENTS

| | | | | |
|---|---|---|---|---|
| 5,714,398 A | * | 2/1998 | Chao et al. ................... | 438/303 |
| 5,817,572 A | * | 10/1998 | Chiang et al. ............... | 438/624 |
| 5,856,225 A | * | 1/1999 | Lee et al. .................... | 438/291 |
| 6,063,675 A | * | 5/2000 | Rodder ........................ | 438/291 |
| 6,127,232 A | * | 10/2000 | Chatterjee et al. .......... | 438/291 |
| 6,146,955 A | * | 11/2000 | Lee .............................. | 438/305 |
| 6,177,303 B1 | * | 1/2001 | Schmitz et al. ............. | 438/194 |
| 6,200,865 B1 | * | 3/2001 | Gardner et al. ............. | 438/291 |
| 6,225,173 B1 | * | 5/2001 | Yu ............................... | 438/301 |
| 6,232,164 B1 | * | 5/2001 | Tsai et al. .................... | 438/217 |
| 6,245,618 B1 | * | 6/2001 | An et al. ..................... | 438/289 |
| 6,271,573 B1 | * | 8/2001 | Suguro ........................ | 257/407 |
| 6,281,559 B1 | * | 8/2001 | Yu et al. ..................... | 257/407 |

FOREIGN PATENT DOCUMENTS

| | | |
|---|---|---|
| EP | 0810647 A2 | 12/1997 |
| EP | 0838849 A2 | 4/1998 |
| EP | 0929105 A2 | 7/1999 |
| JP | 06053237 A | 2/1994 |
| WO | 0117008 A1 | 3/2001 |

\* cited by examiner

Primary Examiner—John F. Niebling
Assistant Examiner—Walter L. Lindsay, Jr.
(74) Attorney, Agent, or Firm—Peter Zawilski (57) ABSTRACT

In a method of manufacturing a semiconductor device comprising a semiconductor body 1 which is provided at a surface 2 with a transistor comprising a gate structure 21, a patterned layer 10 is applied defining the area of the gate structure 21. Subsequently, a dielectric layer 18 is applied in such a way, that the thickness of the dielectric layer 18 next to the patterned layer 10 is substantially equally large or larger than the height of the patterned layer 10, which dielectric layer 18 is removed over part of its thickness until the patterned layer 10 is exposed. Then, the patterned layer 10 is subjected to a material removing treatment, thereby forming a recess 19 in the dielectric layer 18, and a contact window 28,29 is provided in the dielectric layer. A conductive layer 30 is applied filling the recess 19 and the contact window 28,29, which conductive layer 30 is subsequently shaped into the gate structure 21 and a contact structure 26,27 establishing an electrical contact with the surface 2 of the semiconductor body 1.

8 Claims, 12 Drawing Sheets

METHOD OF MANUFACTURING A SEMICONDUCTOR DEVICE

This application is a continuation of application Ser. No. 09/738,917 filed Dec. 14, 2000.

The invention relates to a method of manufacturing a semiconductor device comprising a semiconductor body which is provided at a surface with a transistor comprising a gate structure, by which method a patterned layer is applied defining the area of the gate structure, and a dielectric layer is applied in such a way, that the thickness of the dielectric layer next to the patterned layer is substantially equally large or larger than the height of the patterned layer, which dielectric layer is removed over part of its thickness until the patterned layer is exposed, after which the patterned layer is subjected to a material removing treatment, thereby forming a recess in the dielectric layer, and a conductive layer is applied filling the recess, which conductive layer is shaped into the gate structure.

Such a method is known from U.S. Pat. No. 5,856,225. This method is often referred to as replacement gate technique. In order to subsequently make electrical contact with the surface of the semiconductor body, conventional CMOS process flow steps need to be carried out, that is to say a contact window needs to be etched in the dielectric layer at the area of the planned electrical contact, which contact window needs to be filled by applying a further conductive layer, which further conductive layer needs to be shaped locally into a contact structure establishing the electrical contact with the surface of the semiconductor body.

A disadvantage of this method is that an additional conductive layer is required for the provision of an additional interconnect layer comprising the contact structure establishing the electrical contact with the surface of the semiconductor body. A further disadvantage is that after planarisation of the dielectric layer, a contact to the gate structure is to be made in the same process step as a contact to the semiconductor body, which latter contact requires etching and subsequent metal filling to a larger depth than the former contact.

It is an object inter alia of the invention to provide a method of manufacturing a semiconductor device of the kind mentioned in the opening paragraph, which method enables the provision of an additional interconnect layer without increasing the number of metal deposition steps.

Another object of the invention is to provide a method, which enables the provision of a contact to the gate structure and a contact to the semiconductor body in the same process step, which latter contact requires etching and subsequent metal filling to a similar depth as the former contact.

According to the invention, this object is achieved in that, prior to the application of the conductive layer, a contact window is provided in the dielectric layer, which contact window is filled with the conductive layer, which conductive layer is locally shaped into a contact structure establishing electrical contact with the surface of the semiconductor body.

As the gate structure and an additional interconnect layer comprising the contact structure are provided from a single conductive layer, no additional metal deposition step is needed.

Although only part of the patterned layer may be removed during the material removing treatment and replaced by the conductive layer, it is advantageous to remove the patterned layer completely during this treatment and apply an insulating layer in the recess thus formed at the area of the gate structure, which insulating layer forms a gate dielectric of the transistor. In this way, the flexibility as regards the choice of materials for the gate structure and the gate dielectric is increased. In order to improve the performance of the transistor, it may be advantageous to apply a dielectric material with a dielectric constant higher than that of silicon oxide ($\epsilon$~4) as the gate dielectric and, hence, as the insulating layer from which the gate dielectric is formed. In this respect, tantalum oxide ($Ta_2O_5$; $\epsilon$~20–25), aluminum oxide ($Al_2O_3$; $\epsilon$~10) or silicon nitride ($Si_3N_4$; $\epsilon$~7) can be applied to advantage, as these materials are deposited in a conformal and reproducible way by means of chemical vapor deposition (CVD). The conductive layer, from which the gate structure of the transistor and the contact structure are formed, is advantageously applied by depositing a layer comprising a metal or a combination of metals. In contrast with polycrystalline silicon, which is often applied as a gate material, metals intrinsically have a relatively low resistance and do not suffer from detrimental depletion effects. In this respect, a low-resistance metal such as aluminum, tungsten, copper or molybdenum can be advantageously applied. If a metal or a combination of metals is used, the conductive layer is preferably applied as a double-layer consisting of a layer composed of the metal or the combination of metals on top of a layer acting as adhesion layer, barrier layer, or adhesion layer and barrier layer. In this respect, titanium (Ti) or tantalum (Ta) may be applied as adhesion layer and titanium nitride (TiN), tantalum nitride (TaN) or titanium tungsten (TiW) as barrier layer.

In order to increase the compactness of the semiconductor device, the conductive layer, which fills the recess at the area of the gate structure and the contact window at the area of the contact structure, is advantageously subjected to a maskless material removing treatment until the conductive layer overlying the dielectric layer is removed. In this way the gate structure and the contact structure are fully recessed in the dielectric layer, which is characteristic of a damascene process. The above mentioned maskless removal of the conductive layer is preferably accomplished by means of chemical-mechanical polishing (CMP). A subsequent maskless removal of the insulating layer is not required, but can be beneficial if the insulating layer involves a high dielectric constant material.

In order to suppress e.g. short-channel effects such as punch-though and short-channel threshold-voltage reduction, which effects start to play an important role in the device behavior of MOS transistors with channel lengths decreasing below 2 $\mu$m, impurities can be advantageously introduced via the recess at the area of the gate structure into the semiconductor body in a self-registered way by using the dielectric layer as a mask. The impurities are advantageously introduced into the semiconductor body by means of ion implantation, which in general includes a high-temperature anneal, which is used to restore the damage in the crystal lattice caused by the implantation and to activate the as-implanted impurities.

In order to further increase the compactness of the semiconductor device, the contact structure is advantageously applied covering at least part of an oxide field insulating region, which is provided at the surface of the semiconductor body to separate active regions in the semiconductor body. Such a contact structure is also referred to as a borderless contact In certain circumstances it may be advantageous that the contact structure establishes an electrical contact between active regions separated from each other by an oxide field insulating region. In case of a CMOS inverter, an electrical contact needs to be established between the drain of an NMOS transistor and the drain of an adjacent PMOS transistor.

The contact window may be provided in the dielectric layer by locally etching this layer on the basis of a fixed time or using end-point detection. However, in order to counteract serious etching of the underlying oxide field insulating region, the surface of the semiconductor body at the area of the contact structure is advantageously provided with an etch stop layer prior to the application of the dielectric layer, which etch stop layer is composed of a material with respect to which the dielectric layer is selectively etchable. In this respect, it is advantageous to apply silicon nitride as the etch stop layer and silicon oxide as the dielectric layer. Alternatively, aluminum oxide can be used instead of silicon nitride and/or PSG (phosphosilicate glass) or BPSG (borophosphosilicate glass) instead of silicon oxide.

The patterned layer defining the area of the gate structure of the transistor may be applied composed of, for example, silicon nitride or aluminum oxide. However, in order to match the process flow to conventional CMOS processing, the patterned layer is advantageously applied comprising a semiconductor material.

The patterned layer may be advantageously applied by depositing and patterning a layer comprising a silicon germanium alloy. The layer may be composed of a silicon germanium alloy, which is given by the chemical formula $Ge_xSi_{(1-x)}$, or a silicon germanium alloy with a small percentage of carbon, which is given by the chemical formula $Ge_xSi_{(1-x-y)}C_y$. In these formulas x represents the fraction of germanium lying in the range between about 0.1 and 1, y the fraction of carbon lying in the range between about 0.001 and 0.05, and (1-x) respectively (1-x-y) the fraction of silicon. When subjected to a wet chemical etching treatment in e.g. a hot, concentrated sulphuric acid ($H_2SO_4$) solution, such a silicon germanium alloy etches about 10 times or more faster than silicon.

One embodiment of the method in accordance with the invention, in which silicon is advantageously used as the semiconductor material, is characterized in that the patterned layer is applied by depositing and patterning a layer comprising silicon, and the dielectric layer is applied, after which the patterned layer is subjected to the material removing treatment wherein the silicon of the patterned layer is etched away, thereby forming the recess at the area of the gate structure, after which the dielectric layer is provided with the contact window at the area of the contact structure.

Another embodiment of the method in accordance with the invention, in which silicon is advantageously used as the semiconductor material, is characterized in that, prior to the application of the patterned layer, a masking layer is applied to the surface of the semiconductor body, which semiconductor body is a silicon body, the masking layer being composed of a material with respect to which silicon is selectively etchable, after which the patterned layer is applied by depositing and patterning a layer comprising silicon, and the dielectric layer is applied, which dielectric layer is provided with the contact window at the area of the contact structure, which contact window exposes the masking layer, after which the patterned layer is subjected to the material removing treatment wherein the silicon of the patterned layer is etched away, thereby forming the recess at the area of the gate structure. The masking layer is applied in order to protect the surface of the silicon body at the area of the contact structure from being attacked by the etching mixture applied for etching of the silicon present in the patterned layer. In this respect, silicon oxide may, for example, be advantageously applied as the masking layer, although other materials may also be used.

The dielectric layer is advantageously removed over part of its thickness by means of chemical-mechanical polishing. Experimentally, it is observed that the moment of stopping the chemical-mechanical polishing (CMP) of the dielectric layer is rather critical if the patterned layer comprises semiconductor material. If the CMP process is stopped too early, remainders of the dielectric layer are left on the patterned layer which hinder the subsequent removal of the patterned layer or part of the patterned layer. If the CMP process is carried on too long, the definition of the height of the planned gate structure is adversely affected. In order to improve the height definition of the process, it is advantageous to apply the patterned layer as a double-layer with a first sub-layer comprising the semiconductor material with on top a second sub-layer composed of a material having a larger resistance towards the removal of the dielectric layer than the semiconductor material and being selectively etchable with respect to the dielectric layer. Hence, the second sub-layer will act as etch stop layer during the removal of the dielectric layer. In this respect, it is advantageous to apply silicon nitride as the second sub-layer and silicon oxide as the dielectric layer. Alternatively, aluminum oxide can be used instead of silicon nitride and/or PSG (phosphosilicate glass) or BPSG (borophosphosilicate glass) instead of silicon oxide.

After shaping the conductive layer into the gate structure and the contact structure, a further dielectric layer is applied, in which further dielectric layer vias are etched exposing at least part of the gate structure and at least part of the contact structure, which vias are filled by applying a further conductive layer. By using the method in accordance with the invention, the vias exposing the gate structure and the contact structure are of a similar depth, which facilitates etching and conformal filling of these vias.

These and other aspects of the invention will be apparent from and elucidated with reference to the embodiments described hereinafter and shown in the drawings.

Although the invention is illustrated hereinafter on the basis of a MOS transistor, it will be evident to those skilled in the art that the invention may also be advantageously applied in the manufacture of a MOS transistor with a floating gate, also referred to as floating gate transistor, or of CMOS and BICMOS integrated circuits known per se.

FIGS. 1 to 13 show in diagrammatic cross-sectional views successive stages in the manufacture of a semiconductor device, using a first embodiment of the method in accordance with the invention.

Figure 1:
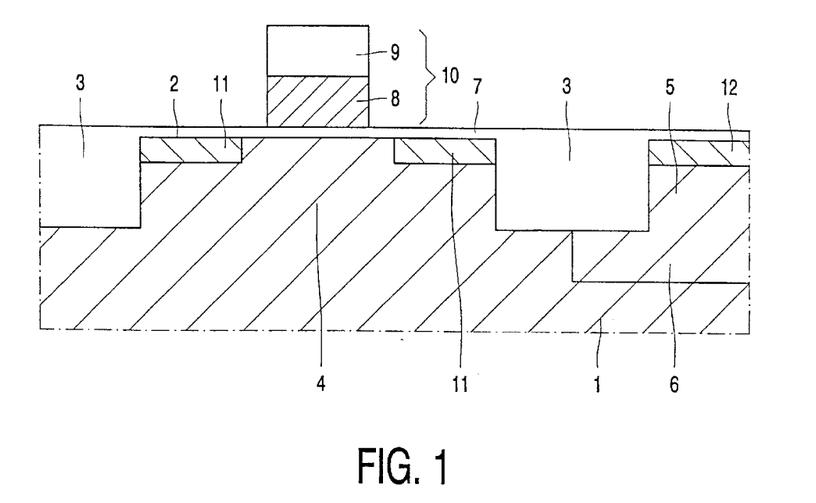
FIGS. 1 to 13 show in diagrammatic cross-sectional views successive stages in the manufacture of a semiconductor device, using a first embodiment of the method in accordance with the invention.

With reference to FIG. 1, a semiconductor body 1 of a first conductivity type, in the present example a silicon body of, for example, p-type conductivity, is provided at a surface 2 with relatively thick oxide field insulating regions 3, which are at least partly recessed in the semiconductor body 1 and which define an active region 4 in which a transistor, in the present example an NMOS transistor, is to be manufactured. Besides the active region 4 an adjacent active region 5 is shown, in which adjacent active region 5 a transistor, in the present example a PMOS transistor, is to be manufactured. The adjacent active region 5 has been included in order to illustrate the formation of a contact structure establishing an electrical contact between the drain of an NMOS transistor and the drain of a PMOS transistor in a CMOS inverter. It should be noted that masks needed to screen the adjacent active region 5 during processing of the active region 4, for example during implantation of the active region 4, and vice versa will not be shown in the figures nor mentioned in the description. For a person skilled in the art it will be clear that such masks are used in several stages of the process.

The thick oxide field insulating regions 3 are formed in a usual way by means of LOCOS (LOCal Oxidation of Silicon) or by means of STI (Shallow Trench Isolation). The adjacent active region 5 is provided with a well 6 of a second, opposite conductivity type, in the present example n-type, by means of ion implantation of a dose of, for example, phosphorus or arsenic, which ion implantation may be advantageously carried out after having provided the surface 2 of the semiconductor body 1 with a sacrificial silicon oxide layer (not shown) by means of, for example, thermal oxidation. Optionally, the active region 4 may be provided with a well of the first conductivity type, in the present example p-type. Subsequently, the surface 2 of the semiconductor body 1 is provided with a layer 7 composed of, for example, silicon oxide, which is covered by a patterned layer 10 defining the area of a gate structure to be provided in a later stage of the process. In the present example, the patterned layer 10 is obtained by depositing a double-layer consisting of a first sub-layer 8 of, for example, polycrystalline silicon, and, on top thereof, a second sub-layer 9 composed of, for example silicon nitride, and patterning the double-layer e.g. in a usual photolithographic way. Any other suitable material such as, for example, aluminum oxide or a combination of materials can be used instead of silicon nitride. Instead of polycrystalline silicon, another semiconductor material such as, for example, amorphous silicon, $Ge_xSi_{(1-x)}$ or $Ge_xSi_{(1-x-y)}C_y$ can be used, with x representing the fraction of germanium roughly lying in the range between 0.1 and 1, y the fraction of carbon lying in the range between about 0.001 and 0.05, and (1−x) and (1−x−y) the fraction of silicon. It is to be noted that the patterned layer 10 may be a single layer as well, composed of, for example, silicon nitride or aluminum oxide or a semiconductor material such as, for example, polycrystalline silicon, amorphous silicon, $Ge_xSi_{(1-x)}$ or $Ge_xSi_{(1-x-y)}C_y$. After applying the patterned layer 10, source/drain extensions 11 of the second, opposite conductivity type, in the present example n-type, are formed on opposite sides of the patterned layer 10 by means of a self-aligned implantation of a relatively light dose of, for example, phosphorus or arsenic, using the patterned layer 10 together with the oxide field insulating regions 3 as a mask. In an analogous way, the adjacent active region 5 is provided with source/drain extensions 12 of the first conductivity type, in the present example p-type (source extension not shown).

Figure 2:
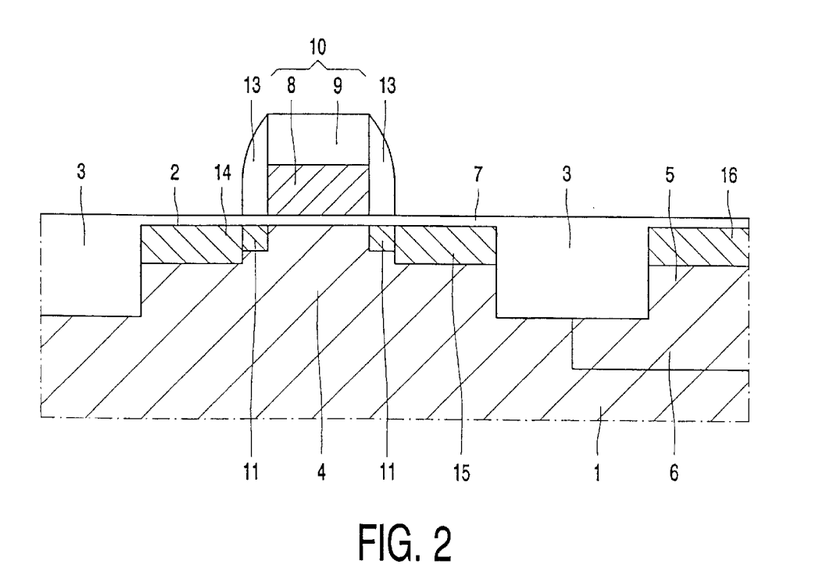

Subsequently, the patterned layer 10 is provided with sidewall spacers 13 e.g. in a known way, for example, by means of deposition and anisotropic etch-back of a silicon oxide layer (FIG. 2). After formation of the sidewall spacers 13, a highly-doped source zone 14 and a highly-doped drain zone 15 of the second conductivity type, in the present example n-type, are formed on opposite sides of the sidewall spacers 13 by means of a self-aligned implantation of a heavier dose of, for example, phosphorus or arsenic, using the oxide field insulating regions 3 together with the patterned layer 10 and the sidewall spacers 13 as a mask. In an analogous way, the adjacent active region 5 is provided with a highly-doped source zone (not shown) and a highly-doped drain zone 16 of the first conductivity type, in the present example p-type.

Figure 3:
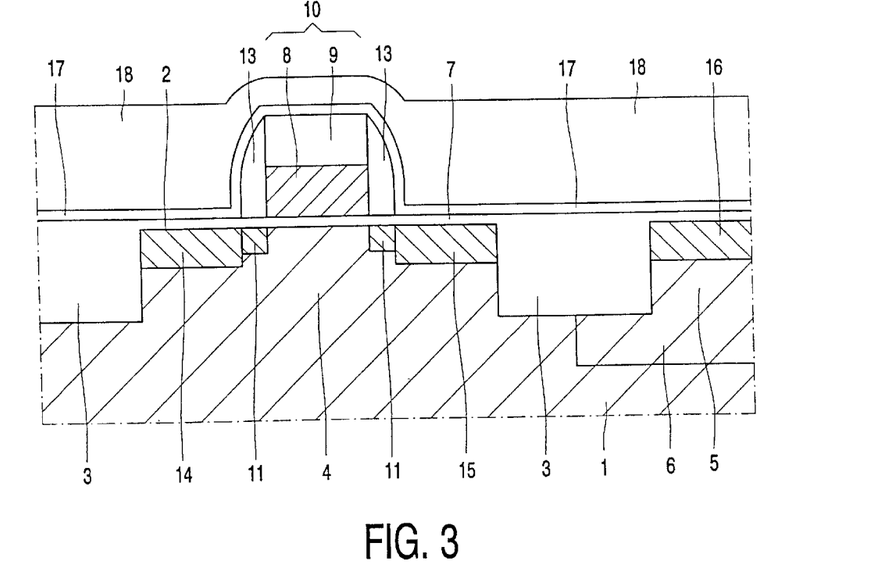

With reference to FIG. 3, an etch stop layer 17, in the present example composed of silicon nitride, and a relatively thick dielectric layer 18, in the present example composed of silicon oxide, are applied, the dielectric layer 18 being applied in such a way, that the thickness of the dielectric layer 18 next to the patterned layer 10 is substantially equally large or larger than the height of the patterned layer 10. Alternatively, aluminum oxide can be used instead of silicon nitride and/or BPSG (borophosphosilicate glass) or PSG (phosphosilicate glass) can be used instead of silicon oxide. The etch stop layer 17 needs to be composed of a material with respect to which the dielectric layer 18 is selectively etchable, in order to counteract serious etching of the oxide field insulating regions 3.

Figure 4:
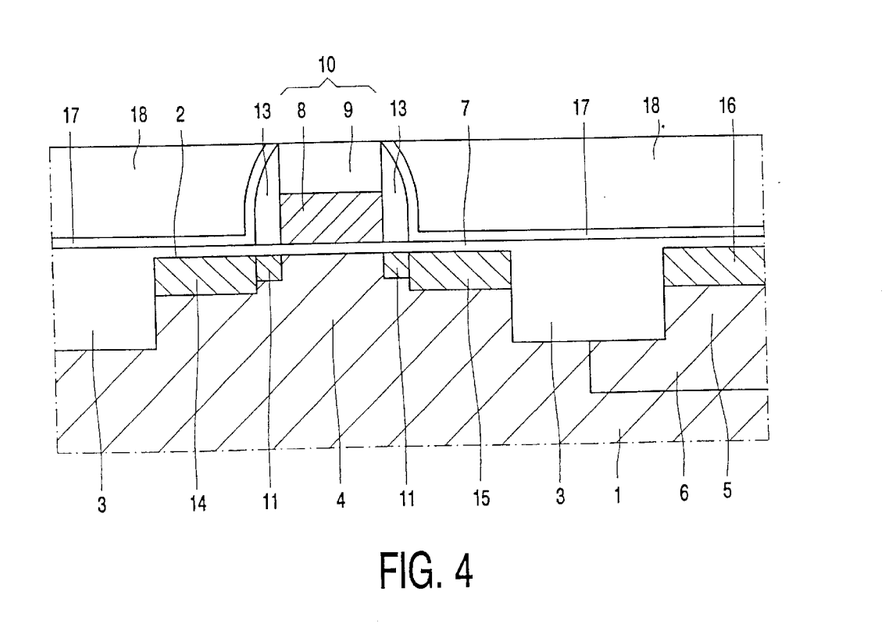
Figure 5:
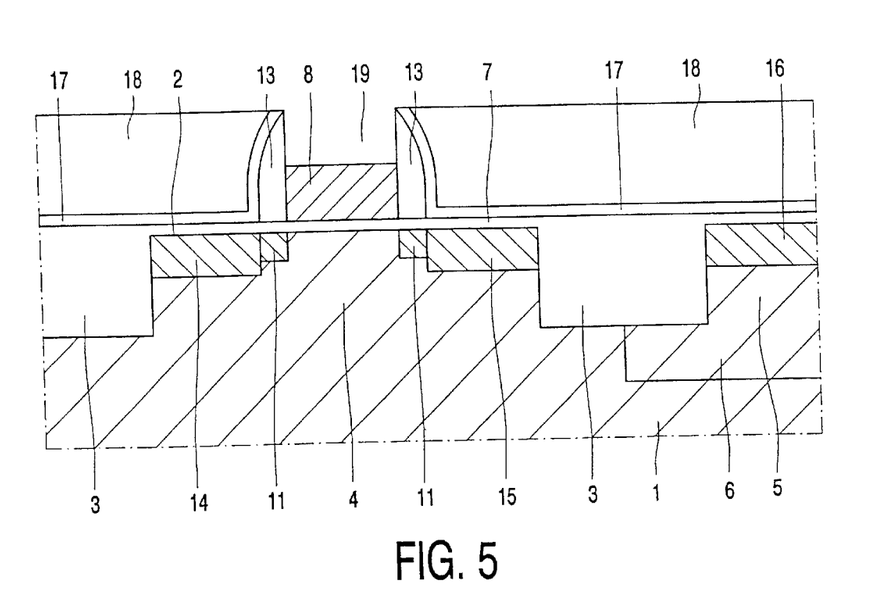

Subsequently, the dielectric layer 18 is removed over part of its thickness until the patterned layer 10 is exposed (FIG. 4). This can be accomplished by means of, for example, chemical-mechanical polishing (CMP) e.g. using a commercially available slurry. During the CMP treatment, the second sub-layer 9, in the present example composed of silicon nitride, will act as a stop layer.

In a next step (FIG. 5), the second sub-layer 9, which is composed of silicon nitride in the present example, is removed selectively with respect to the dielectric layer 18 and the sidewall spacers 13, both composed of silicon oxide in the present example, by means of, for example, wet etching using a mixture of, for example, hot phosphoric acid and sulphuric acid. In this way the dielectric layer 18 is provided with a recess 19 in which the first sub-layer 8 is exposed.

Figure 6:
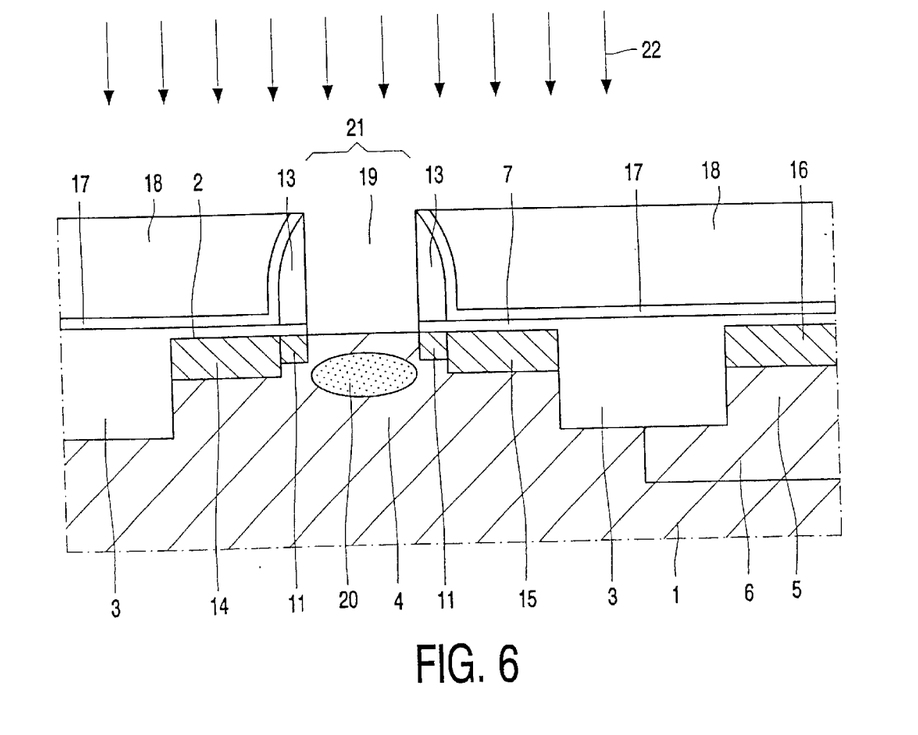

With reference to FIG. 6, the first sub-layer 8 and the layer 7 are removed in two separate etching steps. The first sub-layer 8, in the present example composed of polycrystalline silicon, can be removed selectively by means of wet etching using, for example, a hot KOH solution or by means of plasma etching with, for example, a $HBr/Cl_2$ mixture. The layer 7, in the present example composed of silicon oxide, can be removed by means of wet etching using HF. It should be noted that, alternatively, the layer 7 may be preserved in the recess 19 and used as a gate dielectric of the transistor.

The semiconductor body 1 is provided with an impurity region 20 of the first conductivity type, in the present example p-type, by introducing p-type impurities such as, for example, boron (B), via the recess 19 at the area of the gate structure 21 into the semiconductor body 1 in a self-registered way by using the dielectric layer 18 as a mask. The impurity region 20 can be applied as, for example, a shallow region to suppress short-channel threshold-voltage reduction and/or a deeper region to suppress punch-through between the extended source zone 14,11 and the extended drain zone 15,11 of the NMOS transistor. The impurities are advantageously introduced into the semiconductor body 1 by means of ion implantation as depicted by arrows 22. In this respect, boron may be implanted at an energy ranging from about 20 to 60 keV and a dose of about $2.10^{13}$ atoms/cm². It is understood by those skilled in the art that phosphorus (P) ions or arsenic (As) ions may be implanted in the PMOS transistor for similar reasons. For example, phosphorus may be implanted at an energy ranging from about 100 to 130 keV and a dose of about $2.10^{13}$ atoms/cm², whereas arsenic may be implanted at an energy ranging from about 180 to 240 keV and a dose of about $2.10^{13}$ atoms/cm². The implantation may be carried out substantially perpendicularly to the surface 2 of the semiconductor body 1. However, in order to counteract channeling of the impurities along crystal directions and planes, it is advantageous to perform the implantation at a small angle of a few, for example seven, degrees with respect to the normal to the surface 2 of the semiconductor body 1 by tilting the semiconductor body 1 before implantation. It is to be noted that the shallow region for the suppression of short-channel threshold-voltage reduction and the deeper region for punch-through suppression may be formed in two implantation steps carried out at different energies, or simultaneously in one implantation step at a single energy. In connection with the ion implantation, a high-temperature anneal is carried out at a temperature as high as about 900° C. in order to restore the damage in the crystal lattice caused by the implantation and to activate the as-implanted impurities.

Figure 7:
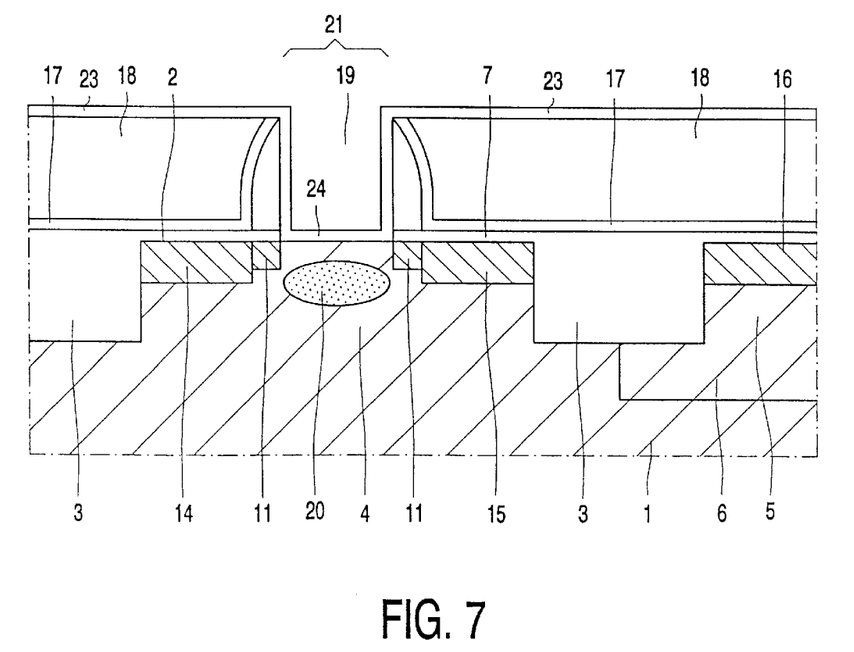
Figure 8:
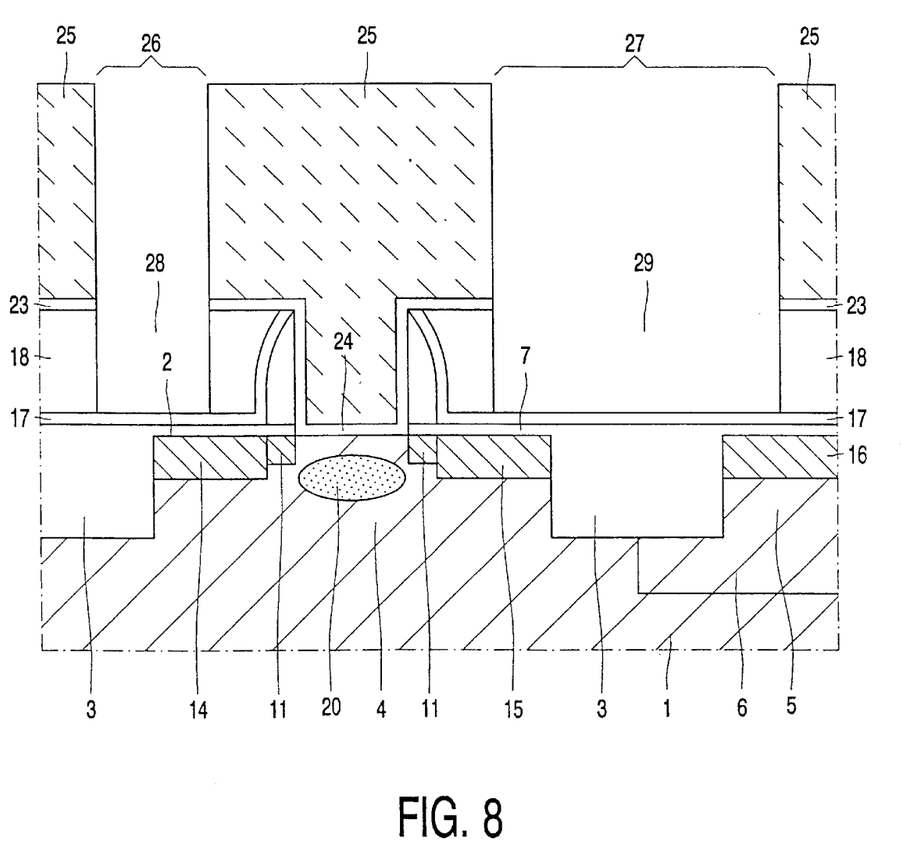

As shown in FIG. 7, an insulating layer 23 is applied to all exposed surfaces, providing a gate dielectric 24 of the transistor. The insulating layer 23 may be composed of silicon oxide, however, a dielectric material with a dielectric constant higher than that of silicon oxide, such as tantalum oxide, aluminum oxide or silicon nitride may be more favorable. If silicon oxide is to be applied for the gate dielectric 24, it may be obtained by means of, for example, chemical vapor deposition or thermal oxidation of silicon. The high dielectric constant materials tantalum oxide, aluminum oxide and silicon nitride can be applied, for example, by means of chemical vapor deposition (CVD).

It is to be noted that the above-mentioned ion implantation for punch-through suppression and/or suppression of short-channel threshold voltage reduction may alternatively be carried out before the removal of the layer 7 or after the application of the insulating layer 23. It is known that a thin layer composed of, for example, silicon oxide, which is present at the surface of the semiconductor body, may improve the characteristics of ion implantation. However, if the insulating layer 23 is composed of a dielectric material with a high dielectric constant, the high-temperature anneal associated with the ion implantation may degrade the dielectric properties of the material applied if the anneal is carried out afterwards.

In a next step (FIG. 8), a resist mask 25 is applied to the semiconductor body 1, which resist mask 25 exposes the insulating layer 23 at the area of contact structures 26,27 to be provided in a later stage of the process. It should be noted that a thin metal layer (not shown) can be advantageously applied prior to the application of the resist mask 25, in order to protect the gate dielectric 24 against contamination. Subsequently, contact windows 28,29 are etched in the insulating layer 23 and the dielectric layer 18 at the area of the contact structures 26,27, which contact windows 28,29 expose the etch stop layer 17. Etching of the dielectric layer 18, in the present example composed of silicon oxide, may be carried out by means of dry etching in, for example, a $CO/C_4F_8$ gas mixture. Since the dielectric layer 18, in the present example composed of silicon oxide, etches much faster in this mixture than the etch stop layer 17, in the present example composed of silicon nitride, the etch process will stop the moment the etch stop layer 17 is reached.

Figure 9:
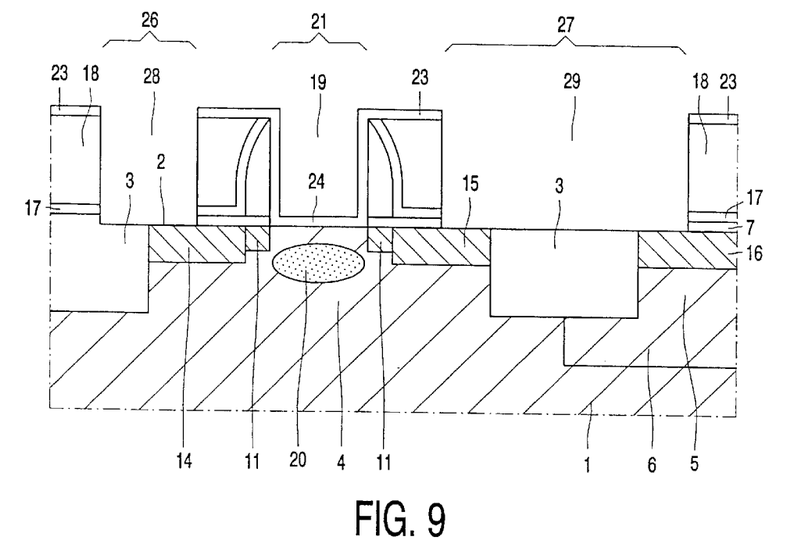

Subsequently, the etch stop layer 17 and the layer 7 in the contact windows 28,29 are removed, thereby exposing the surface 2 of the semiconductor body 1 and the oxide field insulating regions 3 at the area of the contact structures 26,27, the result of which is shown in FIG. 9.

Figure 10:
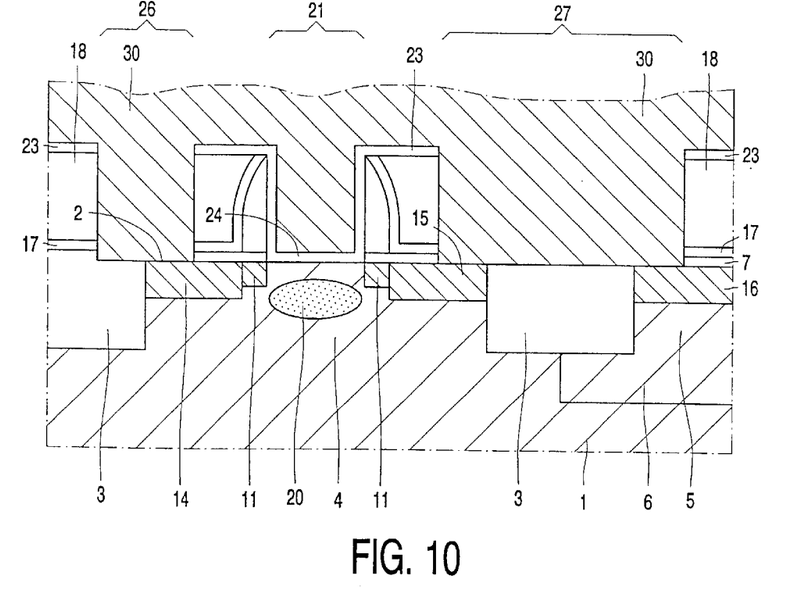

With reference to FIG. 10, a conductive layer 30 is applied to the semiconductor body 1 in a usual way, thereby filling the recess 19 at the area of the gate structure 21 and the contact windows 28,29 at the area of the contact structures 26,27. Polycrystalline silicon, amorphous silicon, $Ge_xSi_{1-x}$ or $Ge_xSi_{1-x-y}C_y$ may be used for the conductive layer 30, with x being the fraction of germanium roughly lying in the range between 0.1 and 1, y the fraction of carbon lying in the range between about 0.001 and 0.05, and (1−x) and (1−x−y) the fraction of silicon. However, the conductive layer 30 advantageously comprises a metal such as aluminum, tungsten, copper or molybdenum, or a combination of metals. If a metal is applied, the conductive layer 30 is advantageously applied as a double-layer consisting of a layer composed of a metal such as aluminum, tungsten, copper or molybdenum, or of a combination of metals on top of a layer acting as an adhesion layer and/or a barrier layer. In this respect Ti or Ta may be applied as an adhesion layer and TiN, TaN or TiW as a barrier layer.

Figure 11:
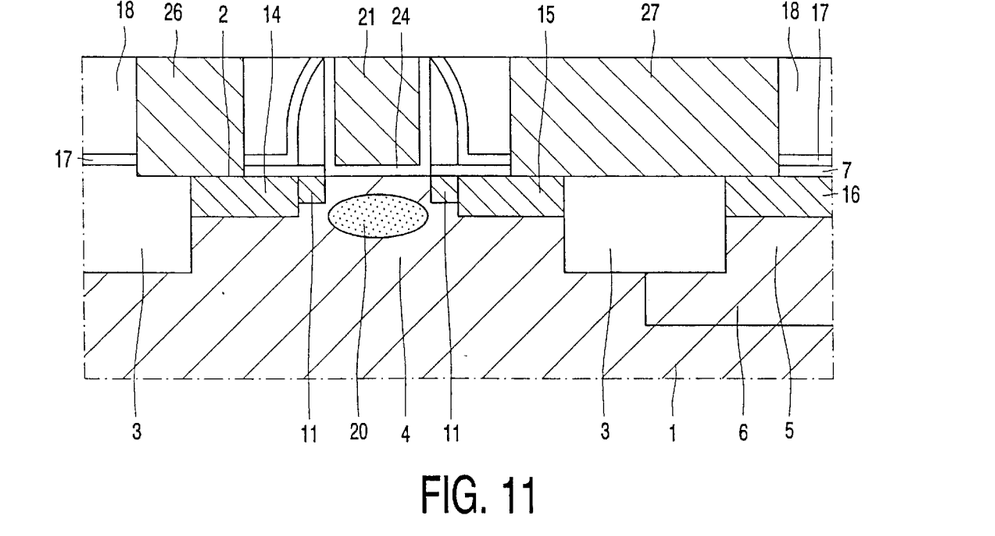

In a next step (FIG. 11), the conductive layer 30 is shaped into the gate structure 21 and the contact structures 26,27. This can be done by means of, for example, etching using an oversized mask. In that case the conductive material of the gate structure 21 and the contact structures 26,27 stretches out over the dielectric layer 18, which is coated with the insulating layer 23, to beyond the recess 19 at the area of the gate structure 21 (see FIG. 9) and to beyond the contact windows 28,29 at the area of the contact structures 26,27 (see FIG. 9). However, the conductive layer 30 is preferably etched in a maskless process until the insulating layer 23 is exposed, thereby forming the gate structure 21 and the contact structures 26,27, which are all recessed in the dielectric layer 18. An additional maskless removal of the insulating layer 23, the result of which is shown in FIG. 11, is not required, but can be beneficial if the insulating layer 23 comprises a high dielectric constant material. Maskless removal of either the conductive layer 30 or both the conductive layer 30 and the insulating layer 23 can be accomplished by means of, for example, chemical-mechanical polishing (CMP) e.g. using a commercially available slurry.

Figure 12:
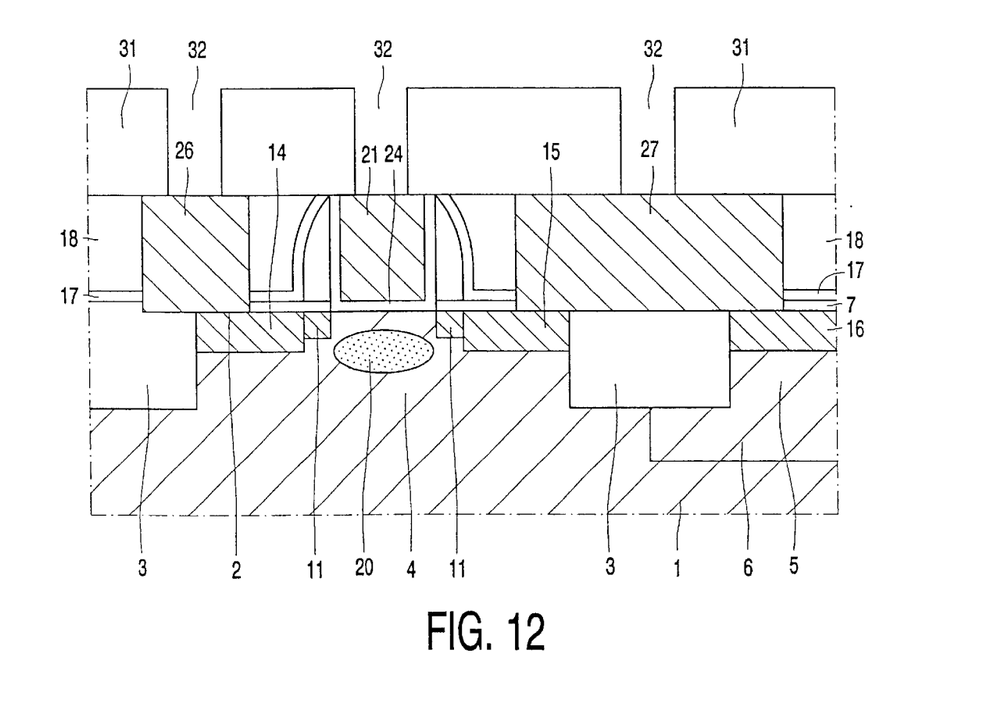
Figure 13:
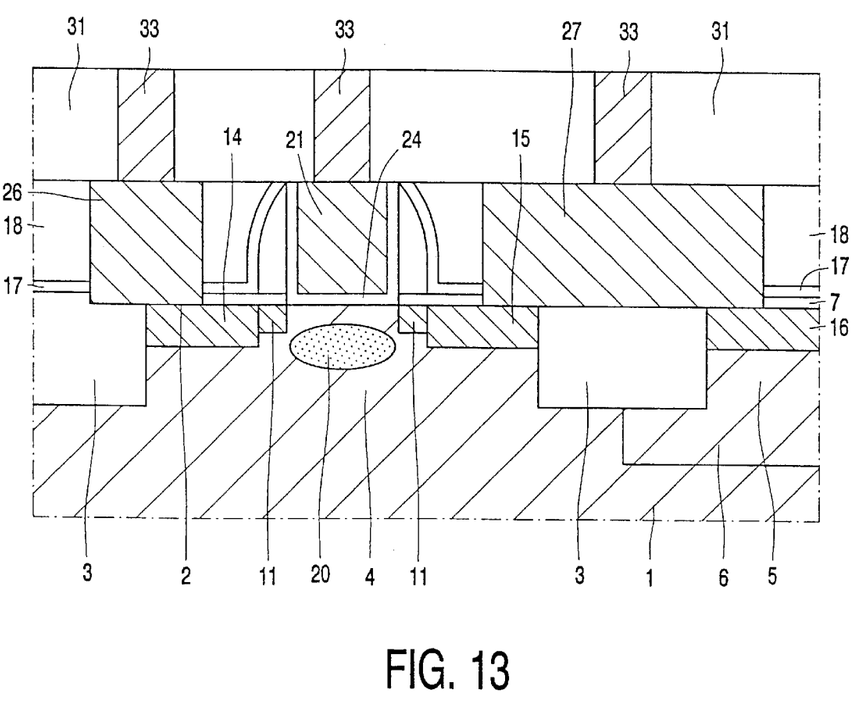

With reference to FIG. 12, a further dielectric layer 31 is applied, which dielectric layer 31 is provided with vias 32 by means of etching, the vias 32 exposing at least part of the gate structure 21 and at least part of the contact structures 26,27. Subsequently, a further conductive layer is applied to the semiconductor body 1, thereby filling the vias 32, which conductive layer can be subsequently etched in a maskless process until the dielectric layer 31 is exposed, thereby forming contact plugs 33 recessed in the dielectric layer 31, the result of which is shown in FIG. 13. It will be clear that the further conductive layer is advantageously applied as a double-layer consisting of a layer composed of a metal such as aluminum, tungsten or copper, or of a combination of metals on top of a layer acting as an adhesion layer and/or a barrier layer. In this respect, Ti or Ta may be applied as the adhesion layer and TiN, TaN or TiW as the barrier layer.

In the above-described embodiment, the recess 19 at the area of the gate structure 21 is formed prior to providing the dielectric layer 18 with the contact windows 28, 29 at the area of the contact structures 26,27.

FIGS. 14 to 20 show in diagrammatic cross-sectional views successive stages in the manufacture of a semiconductor device, using a second embodiment of the method in accordance with the invention, in which embodiment the recess 19 at the area of the gate structure 21 is formed after having provided the dielectric layer 18 with the contact windows 28,29 at the area of the contact structures 26,27.

Figure 14:
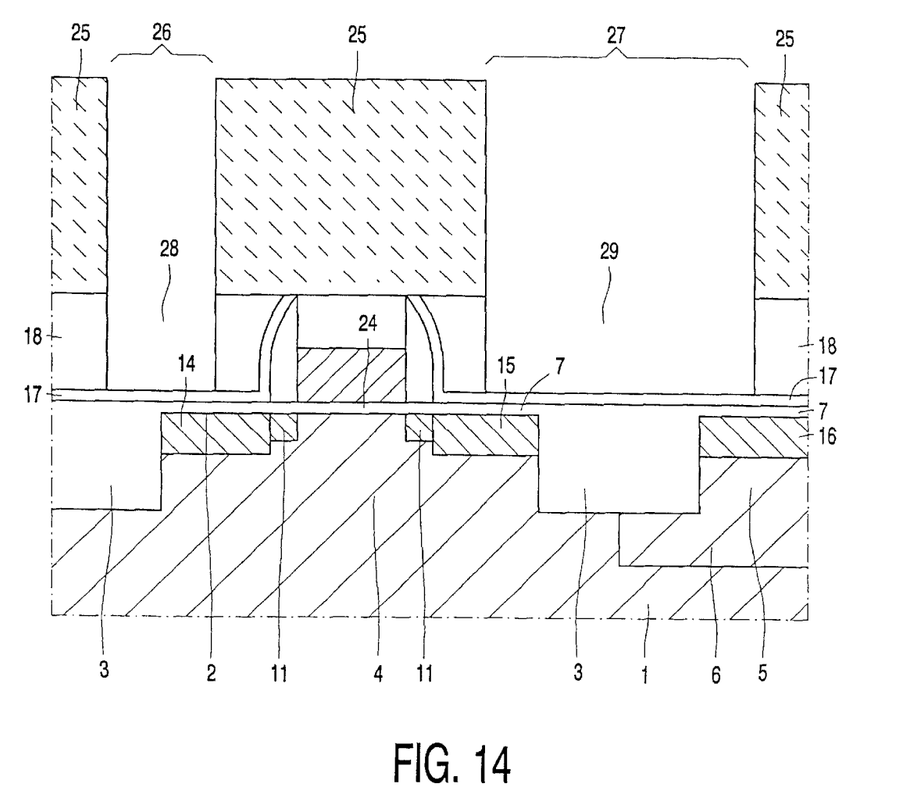
FIGS. 14 to 20 show in diagrammatic cross-sectional views successive stages in the manufacture of a semiconductor device, using a second embodiment of the method in accordance with the invention.

Starting from the situation shown in FIG. 4, the situation shown in FIG. 14 is obtained after applying the resist mask 25 to the semiconductor body 1, which resist mask 25 exposes the dielectric layer 18 at the area of the contact structures 26,27, and etching the contact windows 28,29 in the dielectric layer 18 at the area of the contact structures 26,27, which contact windows 28,29 expose the etch stop layer 17. Etching of the dielectric layer 18, in the present example composed of silicon oxide, may be carried out by means of dry etching in, for example, a $CO/C_4F_8$ gas mixture. Since the dielectric layer 18, in the present example composed of silicon oxide, etches much faster in this mixture than the etch stop layer 17, in the present example composed of silicon nitride, the etch process will stop the moment the etch stop layer 17 is reached.

Figure 15:
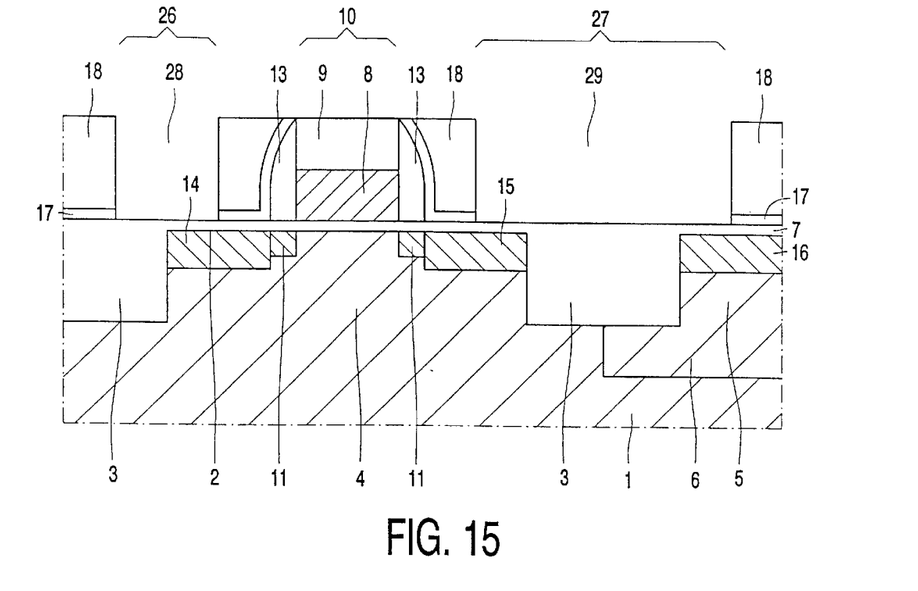

Subsequently, the etch stop layer 17 is removed in the contact windows 28,29, thereby exposing the layer 7 in the contact windows 28,29 at the area of the contact structures 26,27, the result of which is shown in FIG. 15.

In a next step (FIG. 16), the second sub-layer 9, which is composed of silicon nitride in the present example, is removed selectively with respect to the dielectric layer 18 and the sidewall spacers 13, both composed of silicon oxide in the present example, by means of, for example, wet etching using a mixture of, for example, hot phosphoric acid and sulphuric acid. In this way the dielectric layer 18 is provided with a recess 19 in which the first sub-layer 8 is exposed.

Figure 16:
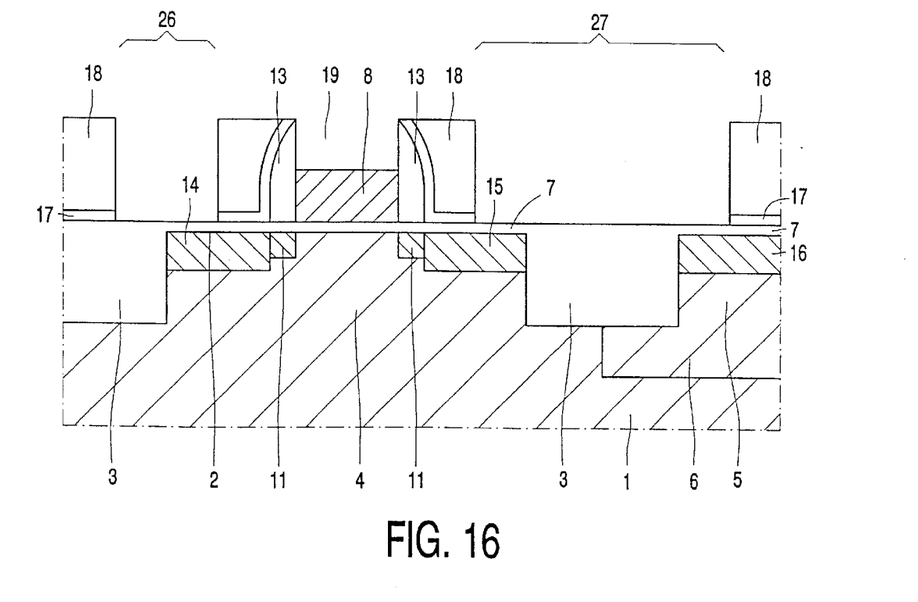

It will be clear that the etch stop layer 17 and the second sub-layer 9, which are both composed of silicon nitride in the present example, can be removed in one step.

Figure 17:
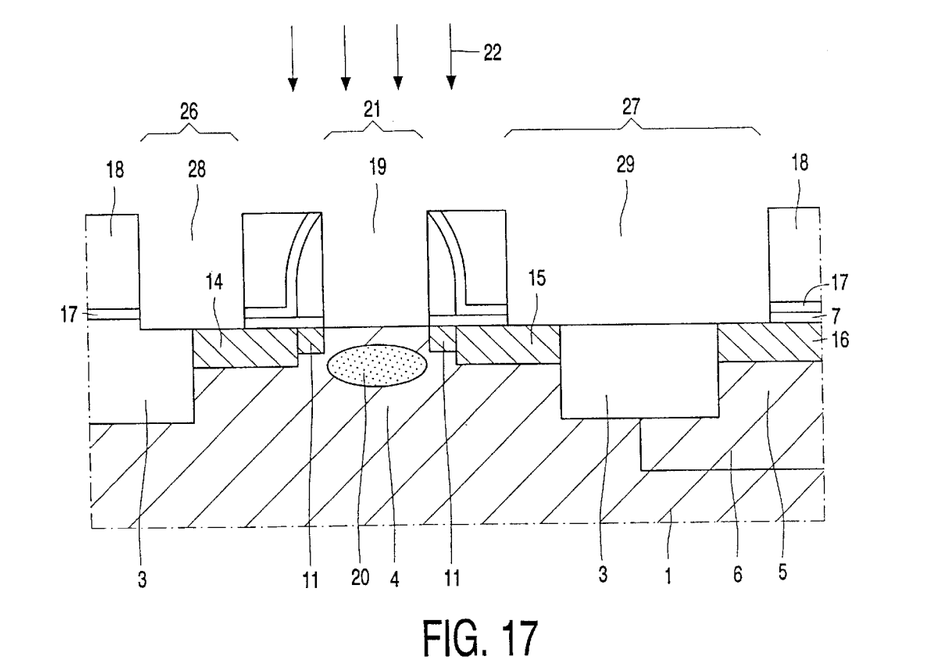

With reference to FIG. 17, the first sub-layer 8 and the layer 7 are removed in two separate etching steps. The first sub-layer 8, in the present example composed of polycrystalline silicon, can be removed selectively by means of wet etching using, for example, a hot KOH solution or by means of plasma etching with, for example, a $HBr/Cl_2$ mixture. In order to protect the surface 2 of the semiconductor body 1, in the present example a silicon body, at the area of the contact structures 26,27 from an attack by the etching mixture applied for the etching of the first sub-layer 8, in the present example composed of (polycrystalline) silicon, the layer 7 has been applied in FIG. 1 as a masking layer, in the present example composed of silicon oxide. The masking layer 7 must be composed of a material with respect to which silicon is selectively etchable. Instead of silicon oxide other materials may be applied as the masking layer 7. It is to be noted that a masking layer is needed if the patterned layer is a single layer composed of silicon or a multi- or double-layer comprising a sub-layer composed of silicon. No masking layer is needed if the patterned layer is a single layer composed of $Ge_xSi_{1-x}$ or $Ge_xSi_{1-x-y}C_y$ or a multi- or double-layer comprising a sub-layer composed of $Ge_xSi_{1-x}$ or $Ge_xSi_{1-x-y}C_y$, with x being the fraction of germanium ranging between about 0.1 and 1, y the fraction of carbon ranging between about 0.001 and 0.05, and (1−x) and (1−x−y) the fraction of silicon. When subjected to a wet chemical etching treatment in e.g. a hot, concentrated sulphuric acid ($H_2SO_4$) solution, such a silicon germanium alloy etches at least about 10 times faster than silicon.

Subsequently, the masking layer 7, in the present example composed of silicon oxide, is removed from the recess 19 at the area of the gate structure 21 and from the contact windows 28,29 at the area of the contact structures 26,27, for example, by means of wet etching using HF. It should be noted that, alternatively, the masking layer 7 may be preserved in the recess 19 at the area of the gate structure 21 and used as a gate dielectric of the transistor. As described with reference to FIG. 6, the semiconductor body 1 is provided at the area of the gate structure 21 is provided with the impurity region 20 of the first conductivity type, in the present example p-type, by introducing p-type impurities such as, for example, boron (B), via the recess 19 at the area of the gate structure 21 into the semiconductor body 1 in a self-registered way by using the dielectric layer 18 as a mask. The impurities are advantageously introduced into the semiconductor body by means of ion implantation, as depicted by arrows 22. The impurity region 20 can be applied as, for example, a shallow region to suppress short-channel threshold-voltage reduction and/or a deeper region to suppress punch-through between the extended source zone 14,11 and the extended drain zone 15,11 of the NMOS transistor.

Figure 18:
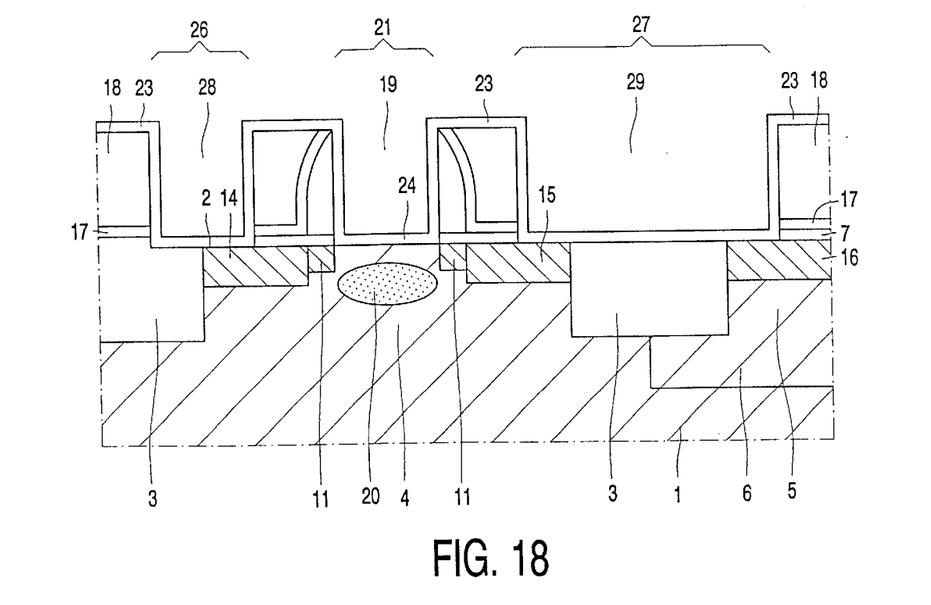
Figure 19:
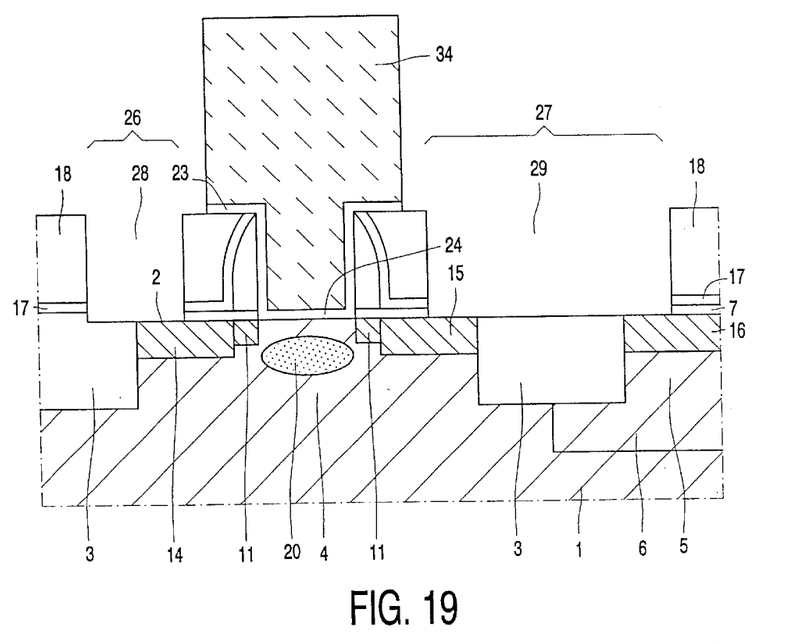

As shown in FIG. 18, the insulating layer 23 is applied to all exposed surfaces, thus forming the gate dielectric 24 of the transistor. The insulating layer 23 may be composed of silicon oxide, however, a dielectric material with a dielectric constant higher than that of silicon oxide, such as tantalum oxide, aluminum oxide or silicon nitride may be more favorable. If silicon oxide is to be applied for the gate dielectric 24, it may be obtained by means of, for example, chemical vapor deposition or thermal oxidation of silicon. The high dielectric constant materials tantalum oxide, aluminum oxide and silicon nitride can be applied, for example, by means of chemical vapor deposition (CVD).

It is to be noted that the above-mentioned ion implantation for punch-through suppression and/or suppression of short-channel threshold voltage reduction may alternatively be carried out before the removal of the layer 7 or after the application of the insulating layer 23. However, if the insulating layer 23 is composed of a dielectric material with a high dielectric constant, the high-temperature anneal associated with the ion implantation may degrade the dielectric properties of the material applied if the anneal is carried out afterwards.

In a next step (FIG. 19), a further resist mask 34 is applied to the semiconductor body 1, which resist mask 34 fills and covers the recess 19 at the area of the gate structure 21 and exposes the insulating layer 23 in the contact windows 28,29 at the area of the contact structures 26,27. It should be noted that a thin metal layer (not shown) can be advantageously applied prior to the application of the further resist mask 34, in order to protect the gate dielectric 24 against contamination. Subsequently, the insulating layer 23 is removed from the contact windows 28,29, thereby exposing the surface 2 of the semiconductor body 1 and the oxide field insulating regions 3 in the contact windows 28,29 at the area of the contact structures 26,27.

Figure 20:
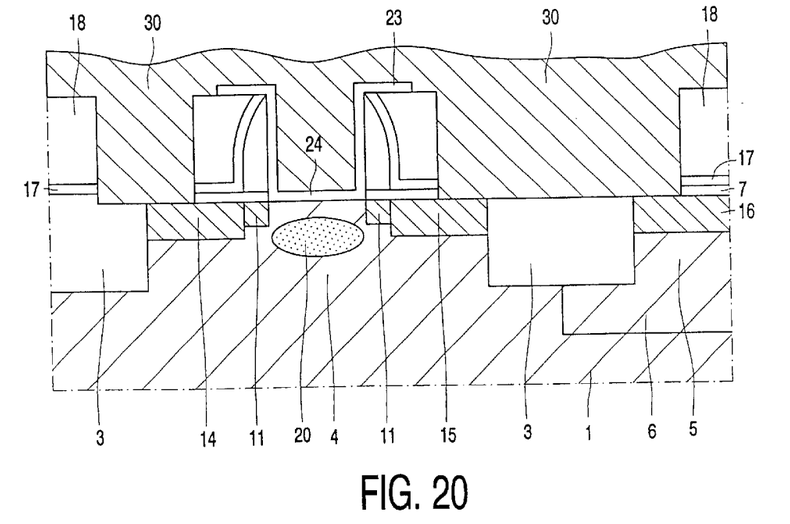

With reference to FIG. 20, the conductive layer 30 is applied to the semiconductor body 1 in a usual way, thereby filling the recess 19 at the area of the gate structure 21 and the contact windows 28,29 at the area of the contact structures 26,27. Polycrystalline silicon, amorphous silicon, $Ge_xSi_{1-x}$ or $Ge_xSi_{1-x-y}C_y$ may be used for the conductive layer 30, with x being the fraction of germanium roughly lying in the range between 0.1 and 1, y the fraction of carbon lying in the range between about 0.001 and 0.05, and (1−x) and (1−x−y) the fraction of silicon. However, the conductive layer 30 advantageously comprises a metal such as aluminum, tungsten, copper or molybdenum, or a combination of metals. If a metal is applied, the conductive layer 30 is advantageously applied as a double-layer consisting of a layer composed of a metal such as aluminum, tungsten, copper or molybdenum, or of the combination of metals on top of a layer acting as an adhesion layer and/or a barrier layer. In this respect Ti or Ta may be applied as the adhesion layer and TiN, TaN or TiW as the barrier layer.

After the application of the conductive layer 30, steps similar to those described with reference to FIGS. 11 to 13 are performed, the results of which are the same as shown in FIGS. 11 to 13.

It will be apparent that the invention is not limited to the embodiments described above, but that many variations are possible to those skilled in the art within the scope of the invention. For example, in both embodiments described above, the first sub-layer of the patterned layer and the surface layer applied underneath it may not be removed after removal of the second sub-layer of the patterned layer. In that case the above-mentioned surface layer will form the gate dielectric of the transistor, whereas the above-mentioned first sub-layer will form part of the gate structure of the transistor. Instead of applying the etch stop layer after the provision of the patterned layer, the etch stop layer may be applied before the patterned layer is provided. In addition, if a masking layer is needed, the masking layer and the etch stop layer may then be applied as a double-layer consisting of a first sub-layer composed of a material with respect to which silicon is selectively etchable, and on top thereof a second sub-layer composed of a material with respect to which the dielectric layer is selectively etchable, or as a single layer composed of a material with respect to which the dielectric layer as well as silicon is selectively etchable. Furthermore, in order to reduce the parasitic resistance of the source zone and the drain zone of the transistor, the source zone and the drain zone may be subjected to a salicide process using Ti or Co, thereby forming self-aligned silicides of Ti ($TiSi_2$) or Co ($CoSi_2$), respectively, on the source zone and the drain zone. Moreover, the source zone and the drain zone can optionally be implanted without extensions.

What is claimed is:

1. A method of manufacturing a semiconductor device comprising a semiconductor body which is provided at a surface with a transistor comprising a gate structure, by which method a patterned layer is applied defining the area of the gate structure, and a dielectric layer is applied in such a way, that the thickness of the dielectric layer next to the patterned layer is substantially equally large or larger than the height of the patterned layer, which dielectric layer is removed over part of its thickness until the patterned layer is exposed, after which the patterned layer is subjected to a material removing treatment, thereby forming a recess in the dielectric layer, and a conductive layer is applied filling the recess, which conductive layer is shaped into the gate structure, characterized in that, prior to the application of the conductive layer, a contact window is provided in the dielectric layer, which contact window is filled with the conductive layer, which conductive layer is locally shaped into a contact structure establishing electrical contact with at least one of a source and drain zone on the surface of the semiconductor body.

2. A method as claimed in claim 1, characterized in that the patterned layer is removed completely in the material removing treatment and an insulating layer is applied in the recess at the area of the gate structure, which insulating layer provides a gate dielectric of the transistor.

3. A method as claimed in claim 2, characterized in that the insulating layer is applied by depositing a layer of a dielectric material having a dielectric constant higher than that of silicon oxide.

4. A method as claimed in claim 1, characterized in that the conductive layer is applied by depositing a layer comprising a metal or a combination of metals.

5. A method as claimed in claim 4, characterized in that the conductive layer is applied as a double-layer consisting of a layer composed of the metal or the combination of metals and on top thereof a layer acting as an adhesion layer, a barrier layer, or an adhesion layer and a barrier layer.

6. A method as claimed in claim 1, characterized in that the conductive layer, which fills the recess at the area of the gate structure and the contact window at the area of the contact structure, is subjected to a maskless material removing treatment until the conductive layer overlying the dielectric layer is removed.

7. A method as claimed in claim 1, characterized in that impurities are introduced via the recess at the area of the gate structure into the semiconductor body in a self-registered way by using the dielectric layer as a mask.

8. A method as claimed in claim 1, characterized in that, after shaping the conductive layer into the gate structure and the contact structure, a further dielectric layer is applied, in which further dielectric layer vias are etched exposing at least part of the gate structure and at least part of the contact structure, which vias are filled by applying a further conductive layer.

* * * * *